United States Patent
Leigh et al.

(10) Patent No.: US 9,918,401 B2
(45) Date of Patent: Mar. 13, 2018

(54) BAY FOR REMOVABLE DEVICE

(71) Applicant: Hewlett Packard Enterprise Development LP, Houston, TX (US)

(72) Inventors: Kevin B Leigh, Houston, TX (US); John Norton, Houston, TX (US); Darrel G Gaston, Spring, TX (US); Matthew E Stevens, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 189 days.

(21) Appl. No.: 14/973,643

(22) Filed: Dec. 17, 2015

(65) Prior Publication Data
US 2017/0181314 A1    Jun. 22, 2017

(51) Int. Cl.
*G02B 6/44* (2006.01)
*H05K 7/14* (2006.01)
*H05K 7/20* (2006.01)

(52) U.S. Cl.
CPC ......... *H05K 7/1489* (2013.01); *G02B 6/4452* (2013.01); *H05K 7/1492* (2013.01); *H05K 7/20554* (2013.01); *H05K 7/20736* (2013.01); *H05K 7/20836* (2013.01)

(58) Field of Classification Search
None
See application file for complete search history.

(56) References Cited

U.S. PATENT DOCUMENTS

| | | |
|---|---|---|
| 8,064,200 B1 | 11/2011 | West |
| 8,358,504 B2 | 1/2013 | McColloch |
| 8,641,429 B2 | 2/2014 | Fish |
| 2006/0126306 A1 | 6/2006 | Blair |
| 2013/0315586 A1* | 11/2013 | Kipp .................. H04Q 11/0005 398/45 |
| 2014/0277784 A1* | 9/2014 | Mick .................. G05D 23/1917 700/286 |
| 2015/0003823 A1 | 1/2015 | Kawanishi |

* cited by examiner

*Primary Examiner* — Jerry Rahll
(74) *Attorney, Agent, or Firm* — Brooks, Cameron & Huebsch, PLLC

(57) ABSTRACT

According to some examples, a bay is provided to receive at least a portion of a housing of a removable device, where the bay includes a management controller to communicate a management signal to the removable device received by the bay, and a cooling mechanism to provide airflow to the removable device received by the bay. The removable device may be one that receives an optical cable, receives an electrical cable, converts a first optical signal received through the optical cable to a first electrical signal transmitted through the electrical cable, and converts a second electrical signal received through the electrical cable to a second optical signal transmitted through the optical cable.

20 Claims, 13 Drawing Sheets

BAY FOR REMOVABLE DEVICE

BACKGROUND

Electrical devices, such as computing devices, may be electrically connected to each other, or be in electrical communication, such that one computing device can send an electrical signal, and another computing device can receive the sent electrical signal. Electrical signals may be transmitted from one computing device to another computing device through an electrical cable. The electrical cable may have an electrical connector on each end of the cable to connect to the transmitting and the receiving computing devices. Further, electrical devices such as computing devices may communicate with other electrical devices using optical communication. A computing device may transmit an optical signal to another computing device, which may receive the optical signal.

BRIEF DESCRIPTION OF THE DRAWINGS

Certain examples are described in the following detailed description in reference to the following drawings.

DETAILED DESCRIPTION

Figure 1:
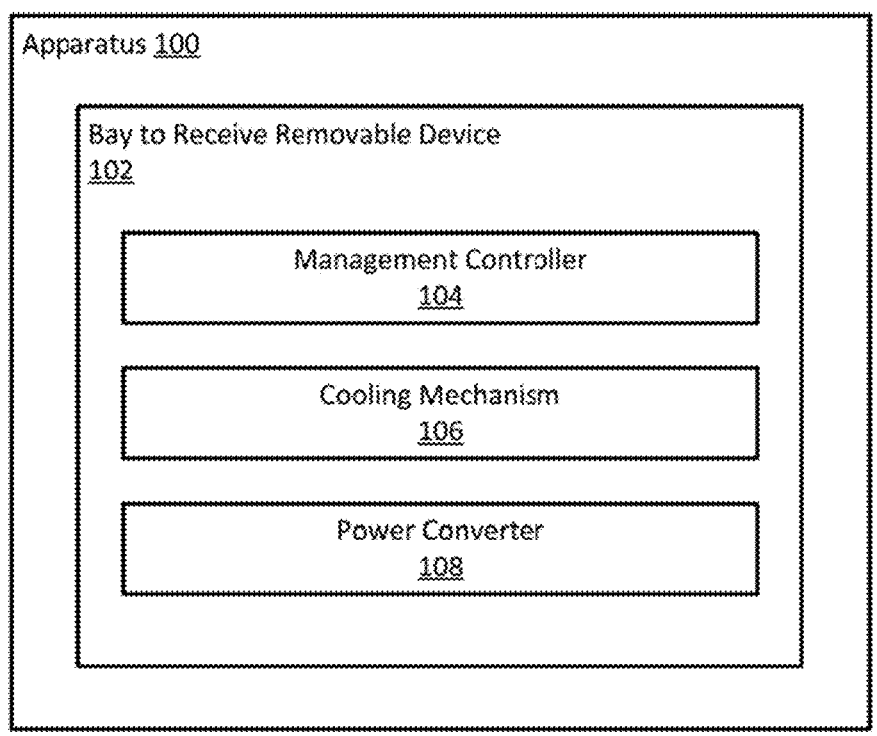
FIG. 1 is a block diagram illustrating an example apparatus according to the present disclosure.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Many electrical devices electrically communicate with other electrical devices over electrical cables. In various instances, an electrical cable may facilitate communication by engaging with an electrical communication port of a first electrical device on one end of the cable and with a second electrical communication port of a second electrical device on the other end of the cable. Generally, electrical cables of larger gauge or diameter are utilized for high-speed signals (e.g., 25 Gbps) when the relative distance between communicating electric devices is larger. Unfortunately, this larger gauge of wire may increase the portion of the volume (e.g., within a server rack or within the data center) that is occupied by the electrical cables. Further, the use of signal conditioning circuitry, such as signal repeaters, may be warranted to maintain signal integrity across the increased length of the electrical connection between the electrical devices, thereby further increasing the occupied volume and power consumption.

Many electrical devices also optically communicate with other electrical devices over optical fibers of optical cables. In various instances, electrical devices maintain optical communication by one electrical device transmitting an optical signal through the optical fibers of an optical cable, and another electrical device receiving that optical signal, and vice versa. An electrical device may optically communicate with multiple other electrical devices using multiple optical cables, or using a single optical cable that contains a sufficient number of optical fibers to carry multiple optical signals to the multiple other electrical devices. The latter type of optical cable may be referred to as an optical trunk cable.

An electrical device may be in electrical communication with another electrical device through the use of optical signal communication. Such an electrical device may have a transceiver to convert the electrical signal of the electrical communication into an optical signal of the optical signal communication, and vice versa. The optical signal may then be sent through an optical cable to a receiving electrical device. The receiving electrical device may have another transceiver to convert the transmitted optical signal back into the electrical signal to complete the electrical communication with the transmitting electrical device.

A first electrical device may electrically communicate with multiple second electrical devices. The multiple second electrical devices may be disposed in a rack, which may be located relatively far away from the first electrical device. It may also be desirable to have the first electrical device electrically communicate with multiple second electrical devices that are disposed in different racks, with each rack in a different location.

A drawback of using an electrical cable from the first electrical device to connect with each of the second electrical devices can include that the utilized electrical cables can occupy a large volume within the overall system. This is particularly true when electrical signals from a first electrical device can actually reach the second electrical devices, and vice versa. For other electrical signals (e.g., 25 Gbps signals), the electrical cable distance may be limited to <5 m for a cable using 26 AWG (American wire gauge) wires—cables using wire size larger than this is usually impractical for bulk, weight, and cost reasons. In addition, the increased diameter of each electrical cable due to the relatively far distance between the first and second electrical devices, as well as the inclusion of any signal conditioning circuitry, may further increase the occupied volume by the cabling within the overall system, as well as increase the cost of such cabling.

Further, the first electrical device may not have enough optical connectors due to a lack of faceplate real estate and/or cost to use a dedicated optical cable for each of the second electrical devices. As described above, an optical trunk cable may be used to enable optical communication between the first electrical device and multiple second electrical devices, using a high-density optical connector on the first electrical device. The desired electrical signals may be converted into optical signals within the first electrical device; however, the optical signals then need to be converted back to electrical signals for each of the second electrical devices. Optical fibers within an optical trunk cable may be split off into multiple optical cables. Each of the split optical cables may couple to an optical transceiver of an electrical device, which may be more expensive than using a single, higher lane count optical transceiver.

A pass-through module may be disposed in each rack of second electrical devices and have one or more transceivers, powered by a local power source, to convert the optical signals from the first electrical device back into electrical signals, receivable by each of the second electrical devices disposed in that rack. The electrical signals may be transmitted from the pass-through module in each rack to the second electrical devices in that rack by electrical cables. A pass-through module may include one or more media-converter modules or multi-channel media converter modules, one or multiple optical transceivers, management logic, cooling fans, a local power supply and a power cord to connect to a power source in a rack.

However, if the pass-through module were to experience a failure or a malfunction, each of the second electrical devices engaged with the pass-through module would no longer be in electrical communication with the first electrical device. This can result in a large fault zone problem where the pass-through module is supporting an entire rack of servers. Though multiple pass-through modules may be used for redundancy, such pass-through modules may occupy a large volume within a rack of second electrical devices. This occupied volume may otherwise be used to increase the number of second electrical devices, or, in other words, increase the density of the rack of second electrical devices.

Additionally, the number of second electrical devices within a rack may vary from rack to rack. Thus, a pass-through module may not, in some racks, have the right number of electrical connectors to transmit the converted electrical signals to each of the second electrical devices disposed within that particular rack. Furthermore, if there is one pass-through module per rack, relatively long electrical cables may also be used to connect the pass-through module with each of the second electrical devices disposed within the rack.

Accordingly, examples of the present disclosure describe a bay to receive at least a portion of a housing of a removable device that can operate as an optical transceiver. As used herein, a removable may be considered installed in the bay once the portion of the housing has been received by the bay. The removable device may be one that, for example, receives an optical cable, receives an electrical cable, converts a first optical signal received through the optical cable to a first electrical signal transmitted through the electrical cable, and converts a second electrical signal received through the electrical cable to a second optical signal transmitted through the optical cable. Such a removable device may replace a pass-through module within a system, may permit transmission of optical signals from a first electrical device to one or more second electrical devices, and may perform media conversion between electrical and optical signals. The bay may include a management controller to communicate a management signal to a removable device received by the bay, and a cooling mechanism to provide airflow to a removable device received by the bay. The removable device may further enable a low-cost connection of high-speed network ports of servers to a network switch at a relatively far distance (e.g., 100 m).

For some examples, both the bay and the removable device it can receive have a small enough form factor such that the bay can be flexibly be placed within a rack without occupying rack unit space. For instance, with a small enough form factor, the bay may be placed between the front and rear RETMA rails or above the rack. This is unlike a pass-through module, which generally requires a rack unit space. Additionally, in some examples, such a small form factor can permit finer granularity of optical/electrical conversion, which can be a problem of using a pass-through module.

By receiving, powering, managing, and cooling a removable device that converts between electrical and optical signals, a bay described herein can free volume within the system that may be used by additional electrical devices. For some examples, the removable device may communicatively couple the first electrical device with one or more second electrical devices while minimizing the length of electrical cables used, thereby reducing the gauge or diameter of such cabling, and removing additional signal conditioning circuitry. Further, such a removable device may free additional volume within the second electrical devices and lower the cost of the second electrical devices. In particular instances, a removable device received by a bay described herein may obviate the need for a rack-mounted electrical/optical media converter or media converter box.

For various examples, a plurality of bays described herein may be utilized to receive multiple removable devices that can be used to communicatively couple the second electrical devices to the first electrical device, thereby allowing the number of second electrical devices disposed in a rack to be changed or adjusted, and avoid a situation where every second electrical device within a system is connected to the first electrical device through a single pass-through module. In this way, the bays can provide a small fault zone and can avoid a single point of failure within the system. For instance, only a portion of the second electrical devices within the system will cease to communicate with the first electrical device, should one of the removable devices experience a failure or a malfunction.

In some examples, a bay described herein may be part of a rack-mountable apparatus (e.g., rack-mountable tray or shelf), which may include a plurality of such bays. Additionally, in some examples, a bay described herein may be integrated into a power distribution unit (PDU), which may include a set of power outlets to supply power to a set of devices (e.g., rack-mounted devices installed in a server rack). A PDU that includes (e.g., integrates) such a bay may comprise a plurality of such bays. The PDU may integrate such bay(s) adjacent to a set of power outlets included by the PDU to provide power to various electronic devices (e.g., servers mounted in a rack).

The following provides a detailed description of the examples illustrated by FIGS. 1-13.

FIG. 1 is a block diagram illustrating an example apparatus 100 according to the present disclosure. As shown in FIG. 1, the apparatus 100 includes a bay 102 to receive a removable device, and the bay 102 includes a management controller 104, a cooling mechanism 106, and a power converter 108. According to some examples, the apparatus 100 is implemented as part of a power distribution unit (PDU) that includes a set of bays 102 and that may be utilized in a data center to power various loads (e.g., data center components such as rack-mount servers and networking equipment). For some examples, the apparatus 100 is implemented a standalone apparatus having a form factor (e.g., a 1 rack unit [U]) that permits the apparatus to be attached to a server rack (e.g., in a data center). As a standalone apparatus, the apparatus 100 may include a strip of bays 102 that can receive and physically support a set of removable devices.

As used herein, modules or other components of various examples (e.g., controllers, mechanisms, and converters) may comprise, in whole or in part, hardware (e.g., electronic circuitry) or a combination of hardware and programming (e.g., machine-readable instructions) to implement functionalities described herein. For instance, a controller may comprise computer-readable instructions executable by the controller to perform one or more functions in accordance with various examples described herein. In another instance, a converter may comprise electronic circuitry to perform one or more functions in accordance with various examples described herein. In yet another instance, a controller may comprise a combination of machine-readable instructions, stored on at least one non-transitory machine-readable storage medium, and at least one processing resource to execute those instructions.

The bay 102 receives a removable device that may receive an optical cable, receive an electrical cable, convert a first optical signal received through the optical cable to a first electrical signal transmitted through the electrical cable, and convert a second electrical signal received through the electrical cable to a second optical signal transmitted through the optical cable. In this way, the removable device that is receivable by the bay 102 may operate as a removable optical transceiver. Depending on the example, the bay 102 may receive at least a portion of a housing of a removable device. Additionally, the bay 102 may receive a removable device by way of one end of the removable device being inserted into the bay 102. Once received by the bay 102, a removable device may be coupled to the bay 102: physically to permit the removable device to be removably secured to the bay 102; electrically to permit an electrical signal to be communicated between the bay 102 and the removable device; electrically to permit the bay 102 to provide power to the removable device; or thermodynamically to permit the bay 102 to cool the removable device (e.g., during the removable device's operations). For instance, the bay 102 may include a retention mechanism (e.g., an opening for receiving a fastener or clip disposed on the removable device) to facilitate the removable securing of the removable device to the bay 102. The bay 102 may include a set of connectors (e.g., traces) to facilitate communication of an electrical signal between the bay 102 and the removable device. The bay 102 may include a set of connectors (e.g., male and female interfaces) to provide power to the removable device. The bay 102 may include a set of couplings (e.g., air duct or heat sink piping) that permit heat to be evacuated from the removable device or cool air to be provided to the removable device, thereby permitting the bay 102 to affect the thermodynamics of the removable device (e.g., during the removable device's operation). The bay 102 may additionally include an alignment mechanism to align the removable device with the bay 102 as the bay 102 receives the removable device.

The management controller 104 of the bay 102 may communicate a management signal with a removable device that is received by the bay 102. Depending on the example, the management signal may comprise control information, configuration information, status information, or other information that facilitates or manages operation of the removable device. For instances, the management signal may comprise control information from the management controller 104 to the removable device that determines operation of the removable device. The management signal may comprise configuration information from the management controller 104 to the removable device to configure the operation of the removable device. The management signal may comprise status information from the removable device to the management controller 104 describing operational status of the removable device. By communicating a management signal with the removable device, the management controller 104 may configure, control, or monitor a removable device, which may be operating as an optical transceiver.

In various examples, the management controller 104 detects whether a removable device that has been received by the bay 102. Upon detection of a removable device, the management controller may cause the bay 102 to provide the removable device power, cooling, or management signals. The management controller 104 can query a status of a removable device that has been received by the bay 102.

The management controller 104 may control overall operation of the bay 102 or control overall operation of a removable device received by the bay 102, and may do so based on a condition or status of the removable device, a condition or status of the bay, or data traffic received over a management communication network. As used herein, a management communication network may be a communications network that permits the management controller 104 communicate with a management controller of a computer system (e.g., server, desktop, laptop, or mobile device), network equipment (e.g., network switch), or the like. For some examples, the management communications network may comprise an out-of-band network utilized by a central management server to manage a plurality of computer systems (e.g., servers), network equipment, or the like, one or more of which may have a lights-out module.

For instance, the management controller 104 may determine how the cooling mechanism 106 (e.g., fan) is operated, and may adjust operation of the cooling mechanism 106 based on the current condition/status of the removable device, current condition/status of the bay 102, or information received over a management communication network (e.g., information from a management controller of a server coupled to and receiving an electrical or optical signal communication from the removable device). In another instance, the management controller 104 may control operation of the power converter 108, and may determine when the power converter 108 provides power a removable device received by the bay 102 and how much power the removable device should receive from the power converter 108. To facilitate communication between the management controller 104 and the management communication network, the bay 102 may include a network interface, such as a wired network interface or wireless network interface. The wireless network interface may comprise a Radio Frequency Identification (RFID) interface or a Near Field Communication (NFC). Alternatively, where the apparatus 100 has a plurality of bays that includes the bay 102, the plurality of bays can share a single network interface (e.g., one included by the apparatus 100).

For some examples, the management controller 104 communicates with a management controller included by a computer system. For instance, the management controller 104 may communicate with a server management controller included by a server. The management controller 104 may communicate with the server management controller over a management communications network. Additionally, the computer system in question may be one that is coupled to, and in electrical or optical signal communication with, a removable device received by the bay 102. For instance, an electrical cable may couple a removable device received by the bay to the computer system.

For various examples, the management controller 104 communicates with a management controller included by network equipment. For instance, the management controller 104 may communicate with a network management controller included by a network switch. The management controller 104 may communicate with the network management controller over a management communications network. Further, the network equipment in question may be one that coupled to, and in electrical or optical signal communication with, a removable device received by the bay 102. For instance, an optical cable may couple a removable device received by the bay to the network equipment.

The cooling mechanism 106 of the bay 102 may cool a removable device received by the bay 102. In some examples, the cooling mechanism 106 cools the removable device by providing air to the removable device. To provide air, the cooling mechanism 106 (and possibly other portions of the bay 102) may include a vent, a duct, or a fan. The cooling mechanism 106 may include, for example, an air duct that couples (e.g., mates) to a corresponding opening (e.g., air intake port) or air duct of the removable device. Such a coupling may occur when the removable device is received by the bay 102. The air provided by the cooling mechanism 106 to the removable device may be supplied from an ambient environment outside of the bay 102 (e.g., ambient environment of a data center in which the apparatus 100 is being utilized). In particular examples, the air may be cooled by the bay 102 before being provided to the removable device. Additionally, the cooling mechanism 106 may include a fan or the like to force air into the removable device to facilitate its cooling.

For some examples, the cooling mechanism 106 includes a vent having adjustable shutters that can selectively adjust the airflow into the bay 102 from the outside of the bay. Additionally, in some examples, the cooling mechanism 106 includes an adjustable-speed fan that can selectively adjust airflow into the bay 102. Where the management controller 104 controls or adjusts operation of the cooling mechanism 106, such control or adjustment may lead t adjustment to the adjustable shutters or the adjustable-speed fan.

The power converter 108 of the bay 102 may provide converted power to a removable device received by the bay 102, and may do so through a set of electrical connectors (not shown) that couples to the removable device after it is received. The power converter 108 may generate the converted power from input power received by the bay 102. For instance, the power converter 108 may include a power cord for receiving input power from the apparatus 100. For some examples, the power converter 108 may supply power to the management controller 104 or the cooling mechanism 106.

Figure 2:
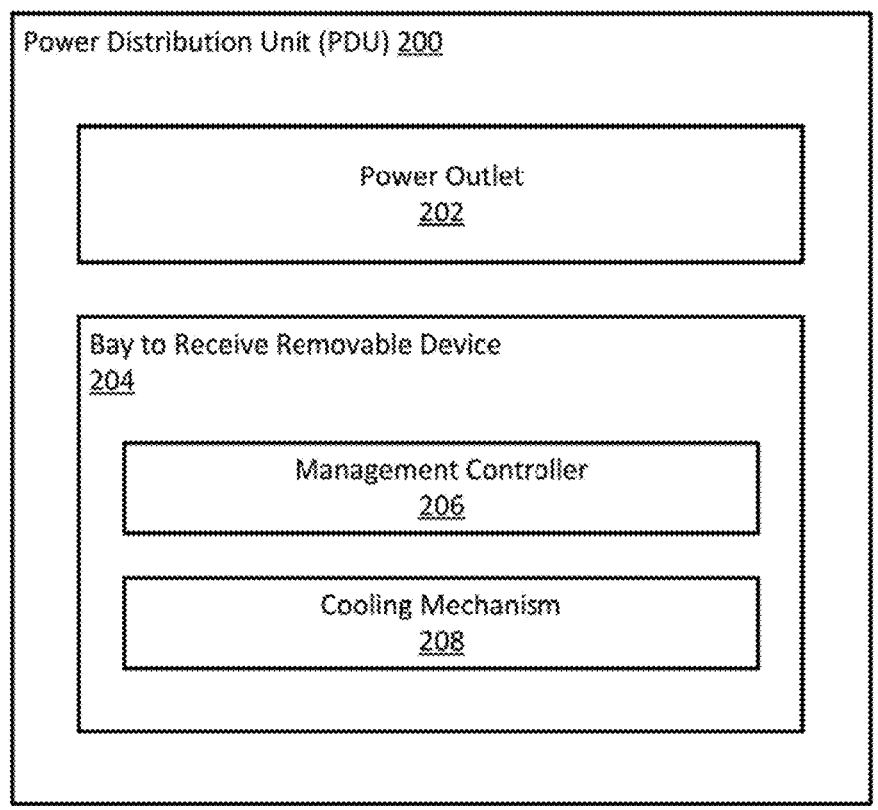
FIG. 2 is a block diagram illustrating an example power distribution unit (PDU) according to the present disclosure.

FIG. 2 is a block diagram illustrating an example power distribution unit (PDU) 200 according to the present disclosure. As shown in FIG. 2, the apparatus the PDU 200 includes a power outlet 202 and a bay 204 to receive a removable device, and the bay 204 includes a management controller 206 and a cooling mechanism 208. As noted herein, the PDU 200 may be utilized in a data center to power various loads, such as data center components like rack-mount servers and networking equipment. As also noted herein, the PDU 200 includes (e.g., integrates) such the bay 204 may be part of a plurality of such bays. The bay 204 may be integrated adjacent to a set of power outlets included by the PDU 200 to provide power to various electronic devices (e.g., servers mounted in a rack.

The power outlet 202 may be a physical component that permits the PDU 200 to provide alternating current (AC) or direct current (DC) power to a load. Depending on the example, the power outlet 202 may comprise an Industry-compatible socket, such as a NEMA 5-15 socket, which may be capable of providing AC power to a power inlet of a computing device (e.g., rack-mount server or network equipment) over a power cable (e.g., one having a NEMA 5-15P connector at one end and IEC-60320-C13 connector at the other end). IN some examples, the power outlet 202 comprises a male or female IEC three-wire connector, such as a IEC-60320-C13 or IEC-60320-C19 socket. The power outlet 202 may provide 120V or 240V AC power.

The bay 204, the management controller 206, or the cooling mechanism 208 of the PDU 200 may be respectively similar in structure and functionality to the bay 102, the management controller 104, and the cooling mechanism 106 of the apparatus 100 as described above with respect to FIG. 1. Depending on the example, the bay 204 may be disposed adjacent to the power outlet 202. For instance, the bay 204 may be disposed in series with the power outlet 202. Where the power outlet 202 is part of a plurality of power outlets of the PDU 200, the bay 204 may be aligned in series with the plurality of power outlets.

Figure 3:
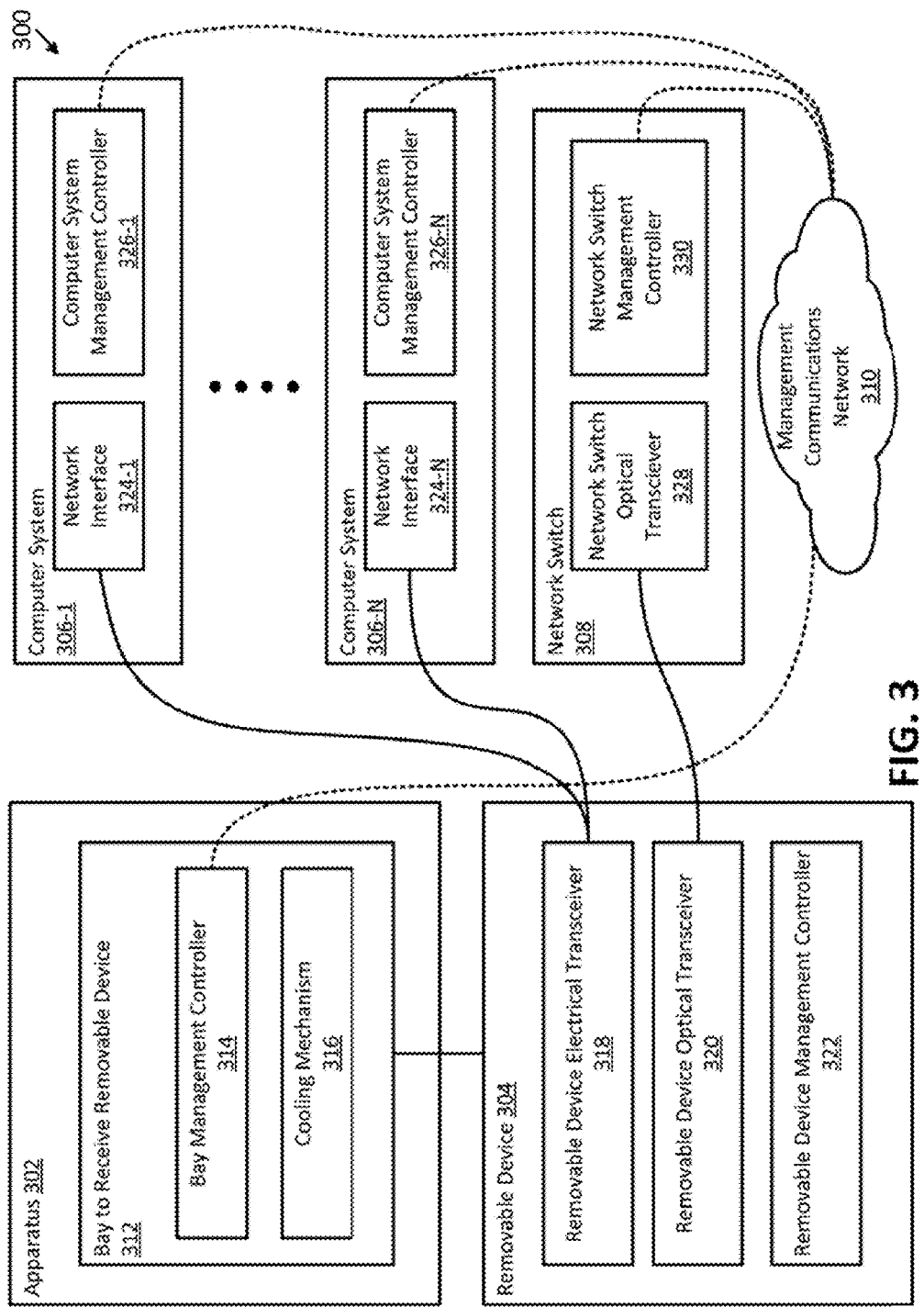
FIG. 3 is a block diagram illustrating an example system utilizing an example apparatus according to the present disclosure.

FIG. 3 is a block diagram illustrating an example system 300 utilizing an example apparatus according to the present disclosure. According to some examples, the system 300 is included in a networked computing environment, such as a data center that includes computer systems (e.g., rack-mount servers), networking equipment (e.g., rack-mount network switches), cooling systems, and other data center components. As shown in FIG. 3, the system 300 includes an apparatus 302, a removable device 304, computer system 306-1 to 306-N (hereafter collectively referred to as computer systems 306), a network switch 308, and a management communications network 310. The apparatus 302 includes a bay 312 to receive a removable device, and couples the removable device 304 to the apparatus 302 (e.g., once the removable device 304 has been received by the bay 312). The removable device 304 includes a removable device electrical transceiver 318, a removable device optical transceiver 320, and a removable device management controller 322. Each of the computer systems 306 respectively includes a network interface 324 and a computer system management controller 326. A network switch 308 includes a network switch optical transceiver 328 and a network switch management controller 330.

For some examples, the apparatus 302 is similar to the apparatus 100 described with respect to FIG. 1, with the bay management controller 314 being similar to the management controller 104 of the apparatus 100 and the cooling mechanism 316 being similar to the cooling mechanism 106 of the apparatus 100. Accordingly, the bay 312 may couple the removable device 304 to the apparatus 302 such that the bay 312 provides the removable device 304 with power, cooling, or electrical data communication, which can include communications relating to management (e.g., configuration, operation, and monitoring) of the removable device 304. The removable device 304 may be coupled to the apparatus 302 via the bay 312 upon some or all of the housing of the removable device 304 being received by the bay 312.

As described herein, the removable device 304 may be one that receives (e.g., couples to) an optical cable and an electrical cable. The removable device 304 may convert an optical signal received through the optical cable to a first electrical signal transmitted through the electrical cable, and convert a second electrical signal received through the electrical cable to a second optical signal transmitted through the optical cable. In this way, the removable device 304 may perform media conversion between electrical signals and optical signals. To facilitate its operation, in FIG. 3, the removable device 304 includes a removable device electrical transceiver 318, a removable device optical transceiver 320, and a removable device management controller 322. The removable device electrical transceiver 318 may facilitate transmission and reception of an electrical signal over an electrical cable coupled to the removable device 304. The removable device optical transceiver 320 may facilitate transmission and reception of an optical signal over an optical cable coupled to the removable device 304.

The removable device management controller 322 may facilitate management (e.g., configuration, control, and monitoring) of the removable device 304 by a management controller remote with respect from the removable device 304. For some examples, the removable device management controller 322 receives a management signal and manages the removable device 304 based on the management signal. As noted herein, the management signal can comprise control information, configuration information, status information, or other information that facilitates or manages operation of the removable device 304. The removable device 304 may send and receive the management signal through the bay management controller 314, which in turn may communicate the management signal with removable device management controller 322 based on communication with another management controller over a management communications network 310. The management communications network 310 may comprise an out-of-band network utilized by a central management server to manage a plurality of computer systems (e.g., servers), network equipment, or the like, one or more of which may have a lights-out module. In particular, as shown in FIG. 3, the bay management controller 314 may be communicatively coupled to the computer system management controllers 326 and the network switch management controller 330 over the management communications network 310. Through the coupling and the bay management controller 314, one or more of the computer system management controllers 326 and the network switch management controller 330 may perform a management function with respect to the bay 312 or the removable device 304.

Within the system 300, the removable device 304 may communicatively couple a first electrical device with a set of second electrical devices. In FIG. 3, the removable device electrical transceiver 318 is electrically coupled to the network interfaces 324 of the computer systems 306, and may be coupled as such over an electrical cable that connects the removable device 304 to the computer systems 306. Additionally, the removable device optical transceiver 320 is optically coupled to the network switch optical transceiver 328, and may be coupled as such over an optical cable that connects the removable device 304 to the network switch 308.

Depending on the example, the computer systems 306 may be mounted in a server rack, the apparatus 302 may be mounted in proximity to (or mounted in) the server rack (e.g., on a frame or on a RETMA rail), and the network switch 308 may be remote from the server rack (e.g., a different server rack). The use of the removable device 304 can minimize the length of electrical cables utilized to couple each of the computer systems 306 to the network switch 308 by way of the removable device 304, as such electrical cables need only to reach the removable device 304 rather than reach the network switch 308 directly. Minimizing the length of electrical cables permits reduced wire gauge (hence reduced diameter of electrical cables to be utilized), thereby providing for more volume within at least the server rack and more volume between the server rack and the network switch 308, both of which can provide better cooling environment with the server rack. Use of the removable device 304 may also eliminate the need of optical transceivers within the computer systems 306, thereby lowering the cost of such computer systems 306. Additionally, as described herein, use of multiple removable devices 304 in this manner can reduce the fault zone size within the system 300.

Figure 4:
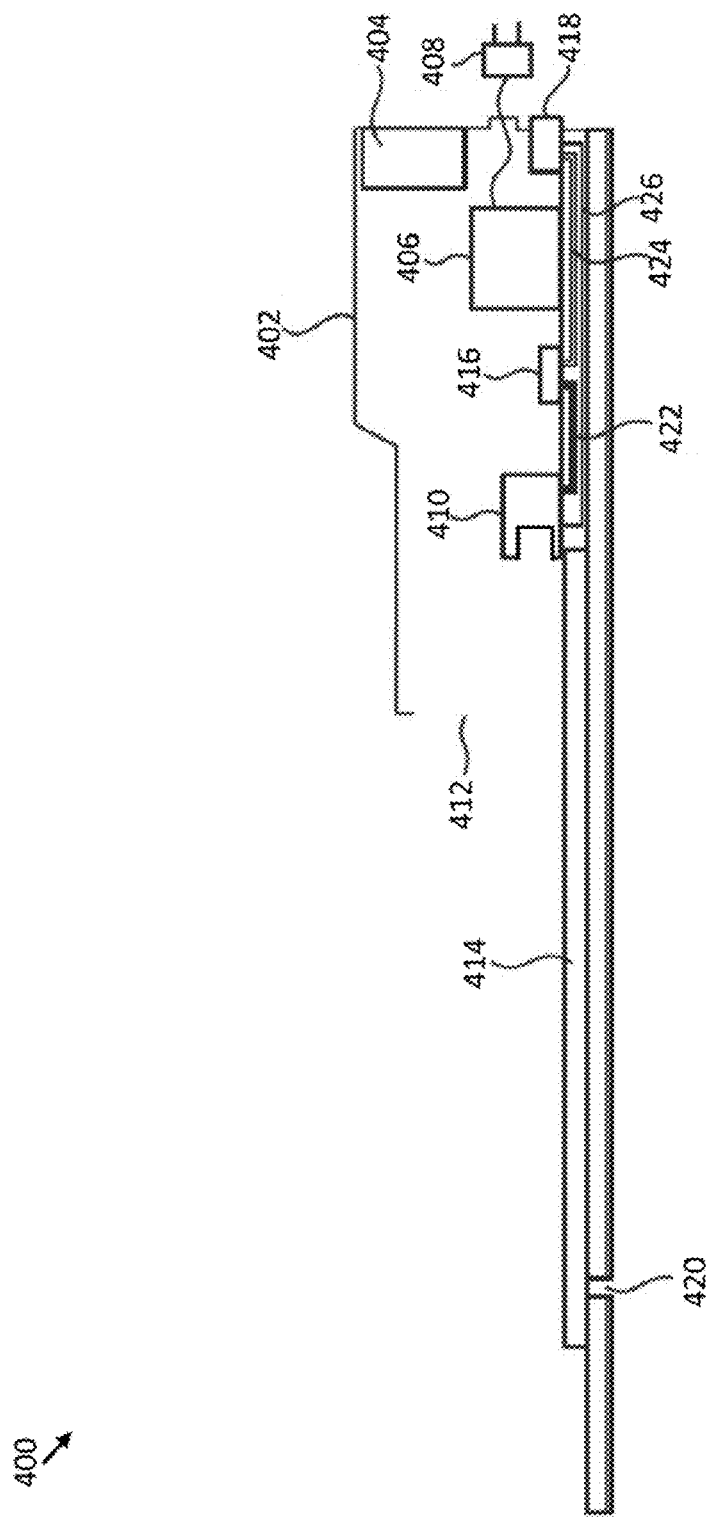
FIG. 4 is a diagram illustrating a cross-sectional view of an example bay to receive a removable device according to the present disclosure.

FIG. 4 is a diagram illustrating a cross-sectional view of an example bay 400 to receive a removable device according to the present disclosure. As shown in FIG. 4, the bay 400 includes a housing 402, electrically coupled (not shown) to the PCB 426, a fan 404, a power converter 406, a power cord 408, an electrical connector 410, an opening 412, an alignment mechanism 414, a management controller 416, a network connector 418, a removable device retention mechanism 420, electrical traces 422 and 424, and a printed circuit board (PCB) 426. According to various examples, the bay 400 operates as an adapter for supplying power, cooling, and management network communication to a removable device it receives (e.g., when a removable device is installed in the bay).

The housing 402 includes the opening 412 for receiving a removable device and for supplying air to the removable device when a removable module is received by (e.g., installed in) the bay 400. The fan 404 may be mechanically coupled to the housing 402, and may supply cool air to a removable device through opening 412 when the removable module is received by the bay 400. The housing 402 may include the removable device retention mechanism 420, such as an opening for receiving a fastener or clip, for retaining a removable device within the bay 400 after the removable device has been received. The alignment mechanism 414 may engage with a corresponding alignment mechanism of a removable device to align a removable module within the bay 400.

The power converter 406 may be electrically coupled to the printed circuit board (PCB) 426, and may include a power cord 408 for receiving power from a system in which the bay 400 is installed or implemented (e.g., the apparatus 100). The power converter 406 may supply power to the management controller 416 and the electrical connector 410 through electrical traces (not shown) of the PCB 426. The power converter 406 may also supply power to the fan 404, which may be electrically coupled directly to the PCB 426 (not shown) or indirectly to PCB 426 via electrical wires (also not shown).

The management controller 416, the network connector 418, and the electrical connector 410 may be electrically coupled to the PCB 426. For some examples, the management controller 416 is electrically coupled to the network connector 418 through the electrical traces 424 of the PCB 426. The network connector 418 may receive a network cable of a system to communicate management signals between the bay 400 and a communications network (e.g., a management communications network). In some examples, the management controller 416 is electrically coupled to the electrical connector 410 through the electrical traces 422 of the PCB 426. The electrical connector 410 may engage with a removable device to supply power to the removable device from power converter 406 and to communicate management signals between the removable device and the management controller 416 when the removable device is received by the bay 400.

Figure 5:
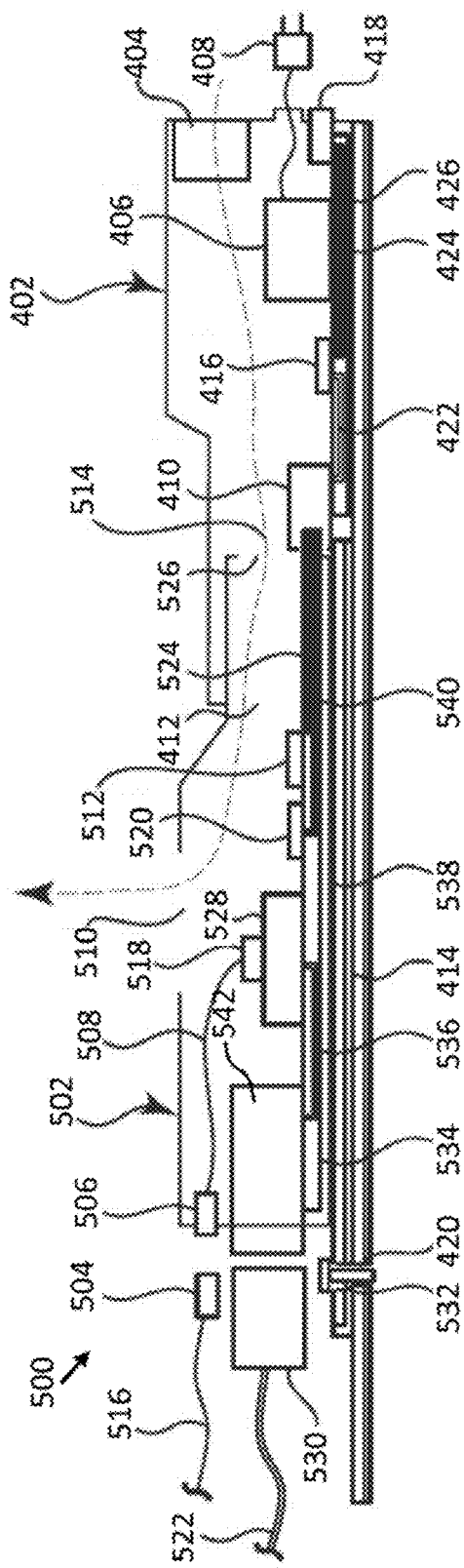
FIG. 5 is a diagram illustrating a cross-sectional view of an example removable device received by the example bay of FIG. 4.

FIG. 5 is a diagram illustrating a cross-sectional view of an example removable device 500 received by (e.g., installed in) the example bay 400 of FIG. 4. As shown in FIG. 5, the removable device 500 includes a housing 502 of the removable device 500, optical cable connectors 504 and 506, an optical jumper 508, an exhaust vent 510, a power conditioner 512, an optical cable 516, an optical connector 518, a management controller 520, an electrical cable 522, electrical traces 524, 536 and 540, an air intake port 526, an optical transceiver 528, electrical cable connectors 530 and 542, a retention mechanism 532, a printed circuit board (PCB) 534, and an alignment mechanism 538.

With the removable device 500 received by (e.g., installed in) the bay 400, the alignment mechanism 538 of the removable device 500 is engaged with the alignment mechanism 414 of the bay 400. The retention mechanism 532, such as a fastener or clip, of the removable device 500 may be engaged with removable device retention mechanism 420 (e.g., opening) of the bay 400 to mechanically secure the removable device 500 to the bay 400. The fan 404 may provide cool air to the removable device 500 through the air intake port 526 of the removable device 500 as indicated by airflow path 514.

In FIG. 5, the electrical connector 410 of the bay 400 receives an edge of the printed circuit board (PCB) 534 of the removable device 500 to electrically couple the removable device 500 to the bay 400. In other examples, the removable device 500 may be electrically coupled to the bay 400 in another suitable manner. The electrical connection between the removable device 500 and the bay 400 may supply power from the bay 400 to the removable device 500 and enables the exchange of management signals between the removable device 500 and the bay 400. In other examples, in place of the electrical connector 410, the bay 400 may include a wireless power interface (not shown), such as an inductive interface or a magnetic field interface to wirelessly provide power to a removable device. In addition, the bay 400 may include a Radio Frequency Identifier (RFID) interface or a Near Field Communication (NFC) interface (not shown) to wirelessly exchange management signals with a removable device.

Figure 6A:
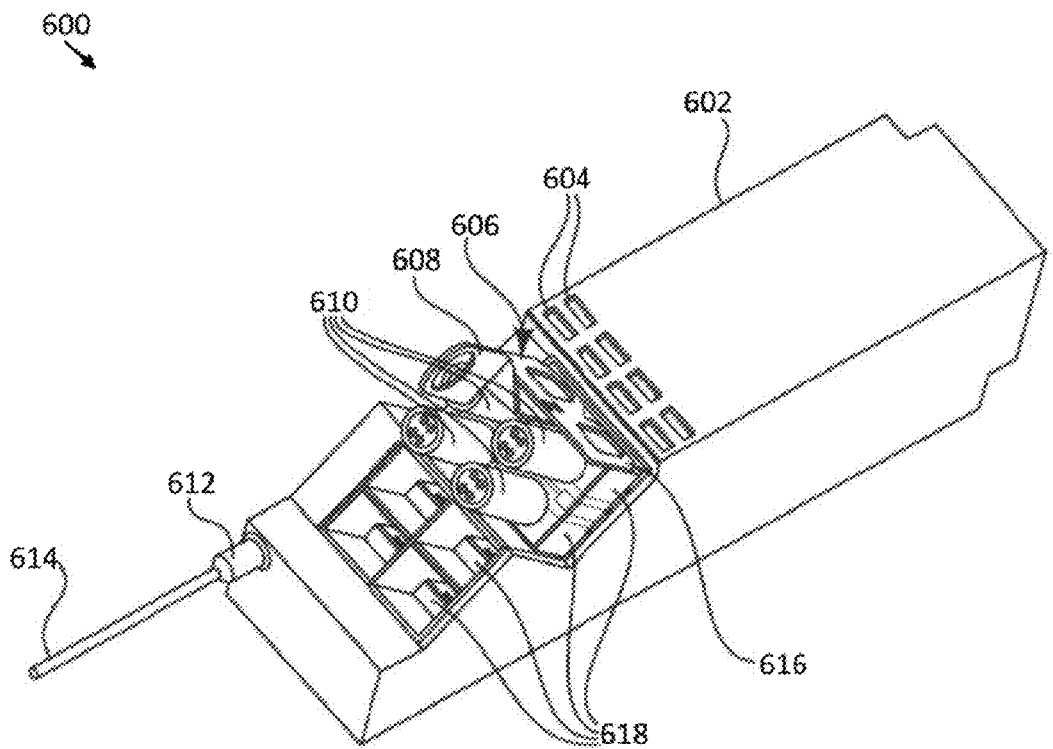
FIGS. 6A and 6B are renderings that illustrate exterior views of an example removable device that is receivable by an example bay according to the present disclosure.
Figure 6B:
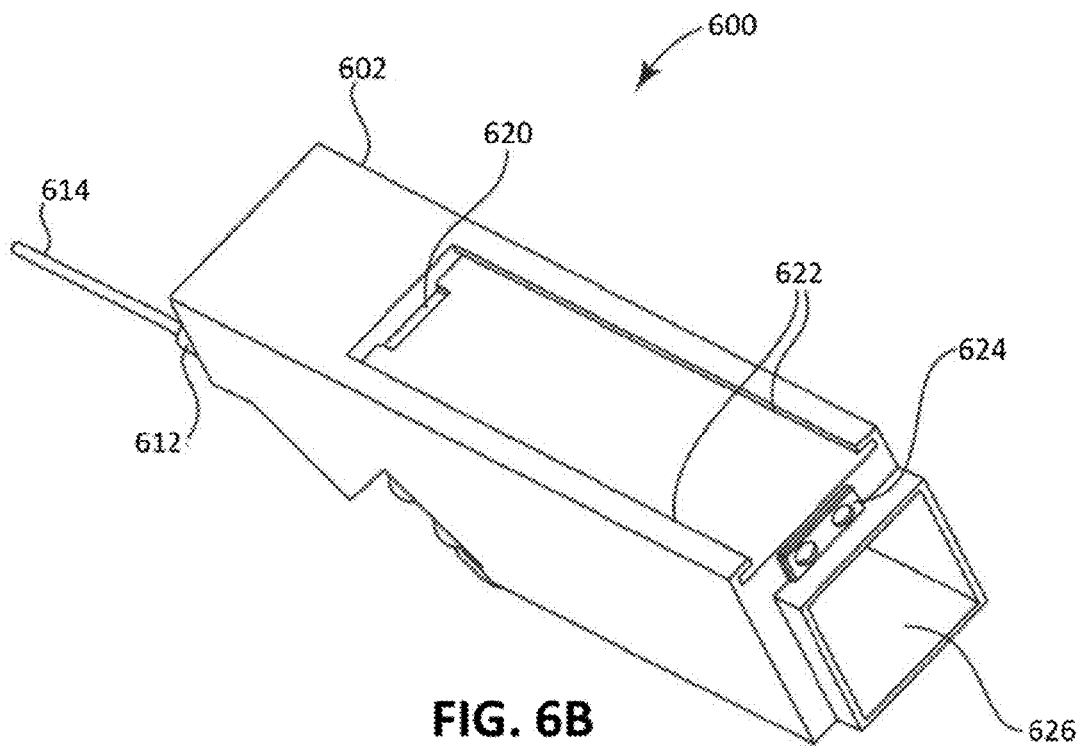

FIGS. 6A and 6B are renderings that illustrate exterior views of an example removable device 600 that is receivable by an example bay according to the present disclosure. As shown in FIGS. 6A and 6B, the removable device 600 includes a housing 602, air exhaust vents 604, an electrical cable assembly 606, a tab 608, electrical cables 610, an optical cable strain reliever 612, an optical cable 614, electrical connectors 616 and 624, electrical receptacles 618, a retention mechanism 620, an alignment mechanism 622, and an air intake port 626.

The housing 602 can enclose a printed circuit board, a power conditioner, and an optical transceiver. The electrical connector 624 may be used to provide power and management signals to the removable device 600 from a bay that receives the removable device 600. The electrical cable assembly 606 includes a plurality of electrical cables 610 terminated to the electrical connector 616. The electrical cable assembly 606 also includes the tab 608 for installing the electrical cable assembly 606 into the electrical receptacles 618 and for removing the electrical cable assembly 606 from the electrical receptacles 618.

The housing 602 includes the air intake port 626, the air exhaust vents 604, the alignment mechanism 622, and the retention mechanism 620. In one example, the air intake port 626 is disposed in a side wall of the housing 602, and the air exhaust vents 604 are arranged in the top wall of the housing 602. The housing 602 may be received by a bay described herein when the removable device 600 is installed. The alignment mechanism 622 may be engaged with a corresponding alignment mechanism of a bay to align the removable device 600. Once installed, the bay supplies cool air to the air intake port 626 for cooling the removable device 600, and the heated air is exhausted through the air exhaust vents 604. The retention mechanism 620 may lock the removable device 600 in place in a bay when the removable device 600 is installed.

As shown in FIG. 6, the electrical cable assembly 606 includes four electrical cables to electrically couple to four of the electrical receptacles 618. In other examples, electrical cable assemblies including a different number of electrical cables for electrically coupling to a corresponding number of the electrical receptacles 618 may be used. For instance, since the removable device 600 includes eight electrical receptacles, it could support eight single cable assemblies, four two-cable assemblies, two four-cable assemblies, or suitable combinations thereof. While the removable device 600 includes eight electrical receptacles 618, in other examples, the removable device 600 may include another suitable number of electrical receptacles, such as 4, 12, 16, 24, or 32. Each of the electrical cables 610 may include multiple pairs of electrical signal wires. One pair of electrical single wires of each of the electrical cables 610 is for transmitting signals from the removable device 600 to a computer system (e.g., a server), and another pair of electrical signal wires of each of the electrical cables 610 is for receiving signals from the computer system.

The optical cable 614 can include a plurality of optical fibers for transmitting/receiving a plurality of optical signals. In some examples, the optical cable 614 is an optical trunk cable to optically couple the removable device 600 to an electrical device (e.g., a network switch). In FIG. 6, the optical cable 614 is fixedly attached to the removable device 600 and extends from inside the housing 602 to outside the housing 602. The optical cable 614 extends through the optical cable strain reliever 612 to prevent strain on the optical connection between the optical cable 614 and the optical transceiver within the housing 602. In other examples, the optical cable 614 is terminated to an optical connector, which may be received by a corresponding optical connector of the removable device 600.

In operation, an optical transceiver within the housing 602 receives optical signals through the optical cable 614 from an electrical device (e.g., a network switch) and converts the optical signals to electrical signals. The electrical signals may then be distributed to a plurality of computer systems (e.g., servers) through the electrical cables 610. The optical transceiver also receives electrical signals from the plurality of computer systems through the electrical cables 610 and converts the electrical signals to optical signals. The optical signals are then transmitted through the optical cable 614 to the electrical device.

Figure 7:
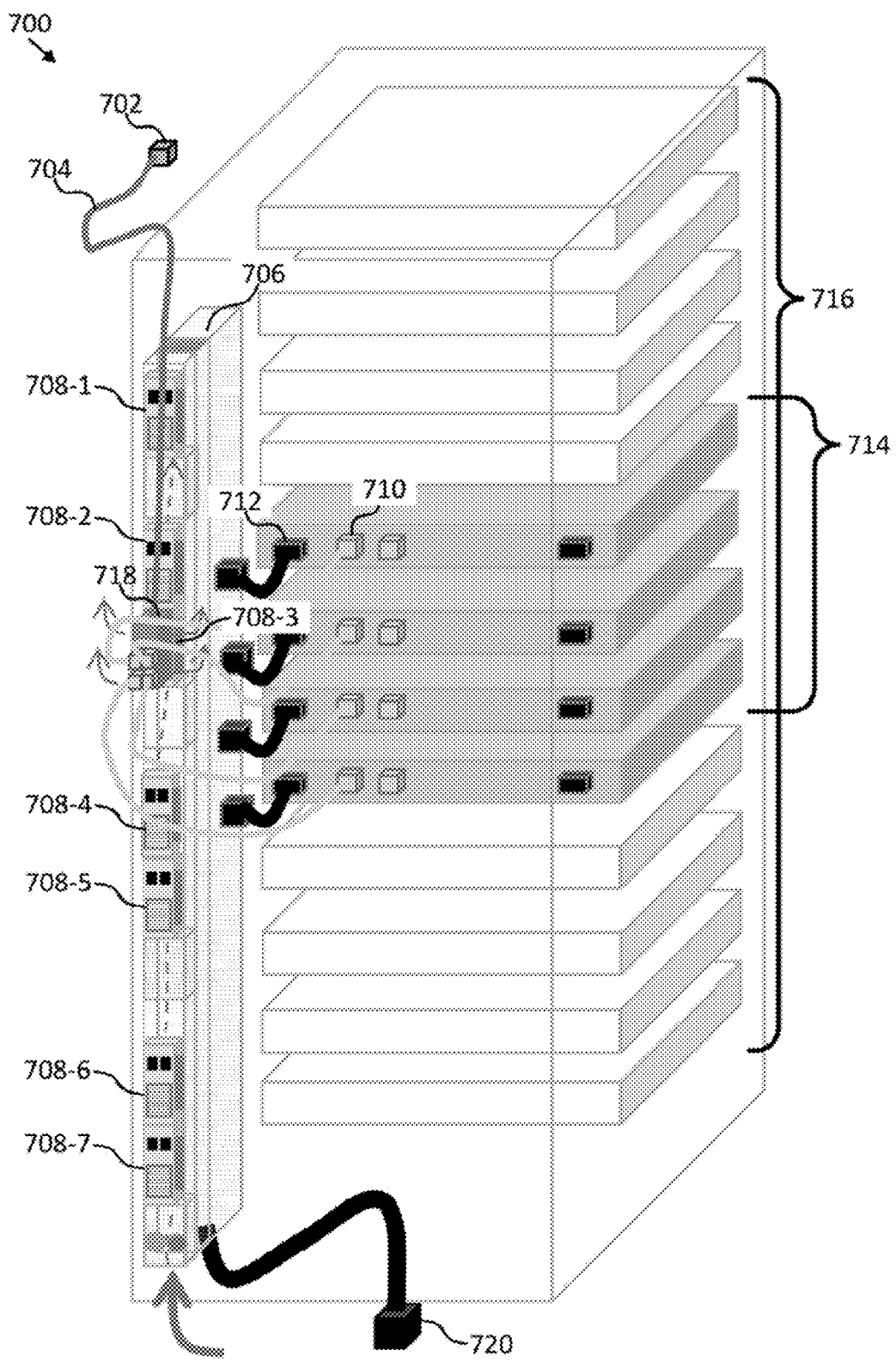
FIG. 7 is a diagram illustrating an example server rack including an example power distribution unit (PDU) according to the present disclosure.

FIG. 7 is a diagram illustrating an example server rack 700 including an example power distribution unit (PDU) 706 according to the present disclosure. As shown in FIG. 7, the server rack 700 includes a plurality of data center components 716 (e.g., servers and storage systems), and a power distribution unit (PDU) 706 having a set of bays 708-1 through 708-7 (hereafter, collectively referred to as bays 708) capable of receiving a removable device 718, as described herein. For some examples, each of the bays 708 are similar in features, operation and functionality to the bay 400 described with respect to FIGS. 4 and 5, and the removable device 718 is similar in features, operation and functionality to the removable device 500 described with respect to FIG. 5.

Any of the bays 708 may support power outlet for the removable device 718 to be powered, and may include cooling vents to provide air circulation through the removable device 718. The power distribution unit (PDU) 706 may have integrated air ways and fans to pull cool air (e.g., from a room, such as the raised floor of the room), and may deliver air to the removable device 718 via cool air vents of the bay 708 to which the removable device 718 is coupled. Depending on the example, there may be two or more fans associated to the bays 708 in the PDU 706.

As shown in FIG. 7, the removable device 718 is coupled to the bay 708-3, which provides power, cooling, and management signal communications for the removable device 718. As shown, the four electrical connectors of the removable device 718 are electrically coupled to corresponding electrical connectors 710 of four data center components 714 (e.g., servers) over four electrical cables. As shown, the power distribution unit (PDU) 706 provides power to each of the four data center components 714 via power cables that couple to a power socket 712 of each of the four data center components 714. As shown, the PDU 706 receives power from a power socket 720 over a power cord. As shown, during operation, the PDU 706 intakes air from the bottom of the server rack 700, the bay 708-3 pushes the air into the removable device 718 via its cooling vents, and the air pushes out through an exhaust vent of the removable device 718. As further shown, the removable device 718 is optically coupled to an optical connector 702 over an optical cable 704. The optical connector 702 may optically couple to another data center component, such as a network switch.

Figure 8:
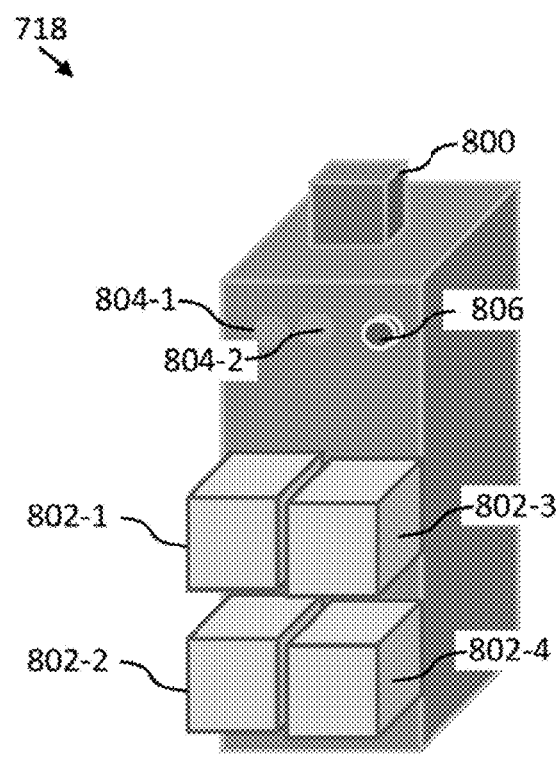
FIG. 8 is a rendering that illustrates an example removable device that is receivable by the power distribution unit (PDU) of FIG. 7.

FIG. 8 is a rendering that illustrates the example removable device 718, which is receivable by the power distribution unit (PDU) 706 of FIG. 7. As shown in FIG. 8, the removable device 718 includes an optical connector 800, electrical connectors 802-1 through 802-4, indicator lights 804-1 and 804-2 (hereafter collectively referred to as indicator lights 804), and a remove request button 806. As noted herein, for some examples, the removable device 718 is similar in features, operation and functionality to the removable device 500 described with respect to FIG. 5. Though the removable device 718 is illustrated with a plurality of electrical connectors and a single optical connector, for other examples, the removable device 718 may include a single electrical connector and a plurality of optical connectors, or may include a plurality of electrical connectors and optical connectors. The indicator lights 804 may provide the operational status of the PDU 706 (e.g., enabled, disabled, busy, or idle). For instance, when the PDU 706 during normal operation, one or more of the indicator lights may blink green.

When the PDU 706 is inserted into a bay as described herein, it may be automatically powered-up and initialized for operation. In some examples, before the PDU 706 is removed from a bay, an individual (e.g., data center administrator) can press the remove request button 806 prior to the PDU's 706 removal. After the individual presses the remove request button 806, one or more of the indicator lights 804 may indicate when the PDU 706 is ready for removal from the bay (e.g., one or more of the indicator lights 804 changes to solid red). By pressing the removal request button 806, the individual can inform a management controller of the bay that the individual intends to physically remove the PDU 706 from the button. Upon receiving such information, the management controller may update its own records associated with its management of the bay, and may safely power-down the PDU 706 (or perform other steps) prior to its removal.

Figure 9:
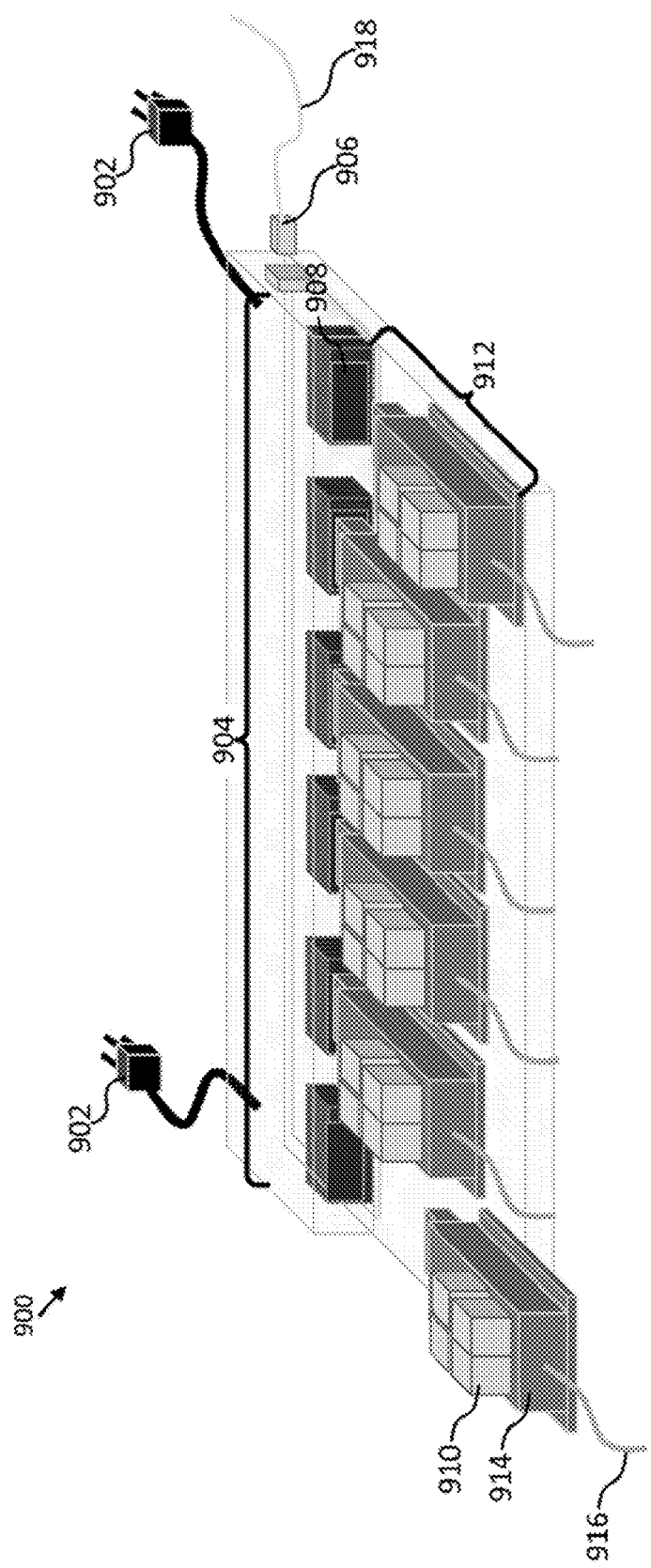
FIG. 9 is a rendering that illustrates an example power distribution unit (PDU) with example removable devices according to the present disclosure.

FIG. 9 is a rendering that illustrates an example power distribution unit (PDU) 900 with example removable devices 914 according to the present disclosure. According to some examples, the PDU 900 has a 1 rack unit (U) form factor, has multiple bays for receiving removable devices as described herein, and has a shelf configuration to support the removable devices received by the multiple bays. As shown in FIG. 9, each of the removable devices 914 includes electrical connectors 910 capable of electrically coupling to an electrical cable, and is optically coupled to an optical cable 916. As shown, the PDU 900 includes power plugs 902 that provide input power to the PDU 900, a set of bays 904, a planar surface 912 to support the removable devices 914 when received by the set of bays 904 disposed at the end of the planar surface 912, and bay openings 908 of the set of bays 904 for receiving the removable devices 914. As further shown, the PDU 900 includes a network port connector 906 to couple to a network cable 918. Through the network port connector 906, the PDU 900 can provide connection to a management controller controlling the set of bays 904. In one example, the network port connector 906 may be an electrical connector and the network cable 918 may be an electrical cable. In another example, the network port connector 906 may be an optical connector and the network cable 918 may be an optical cable.

For some examples, each bay in the set of bays 904 is similar in features, operation and functionality to the bay 400 described with respect to FIGS. 4 and 5, and each of the removable devices 914 is similar in features, operation and functionality to the removable device 500 described with respect to FIG. 5.

Figure 10:
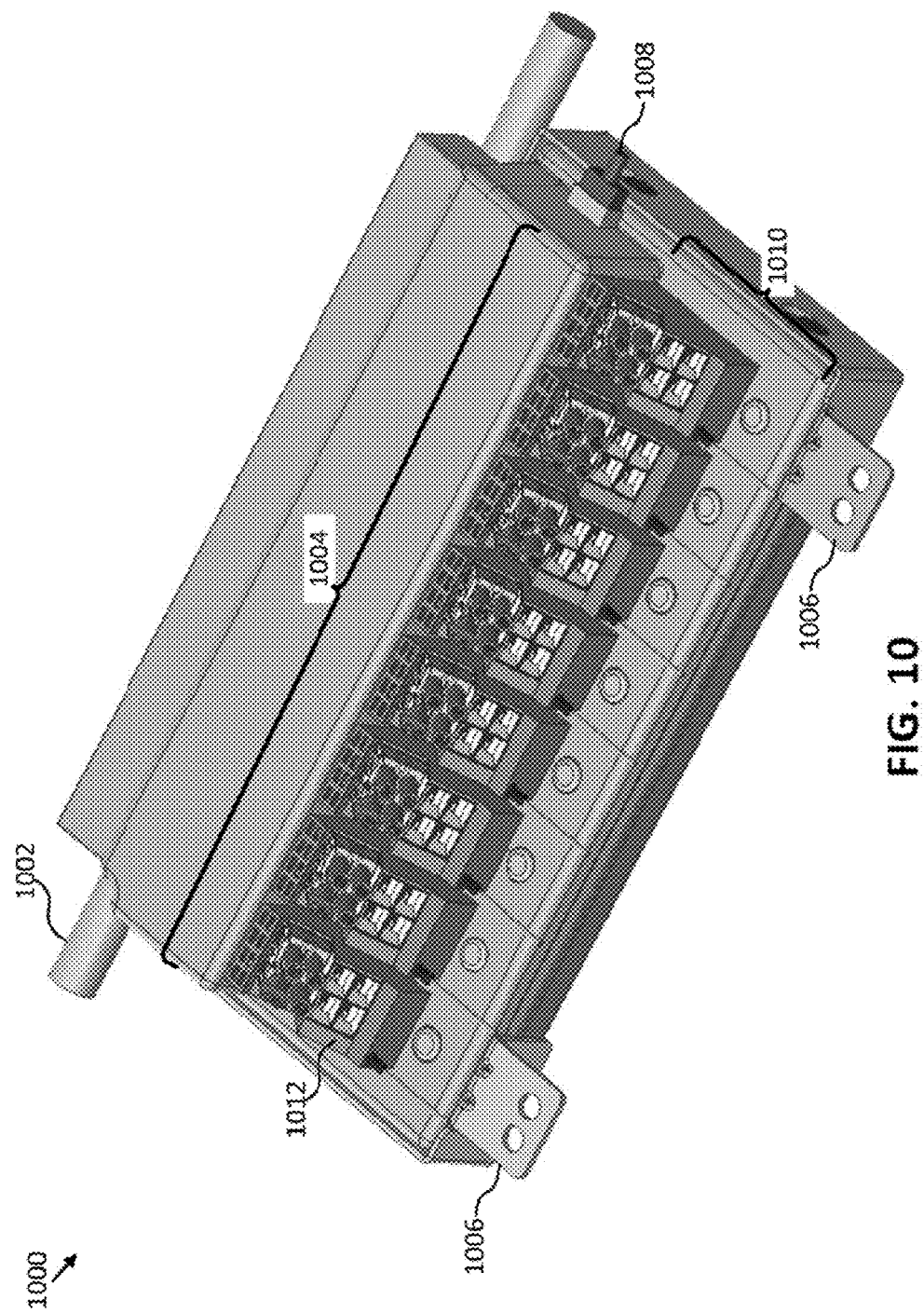
FIGS. 10 and 11 are renderings that illustrate an example power distribution unit (PDU) with example removable devices according to the present disclosure.
Figure 11:
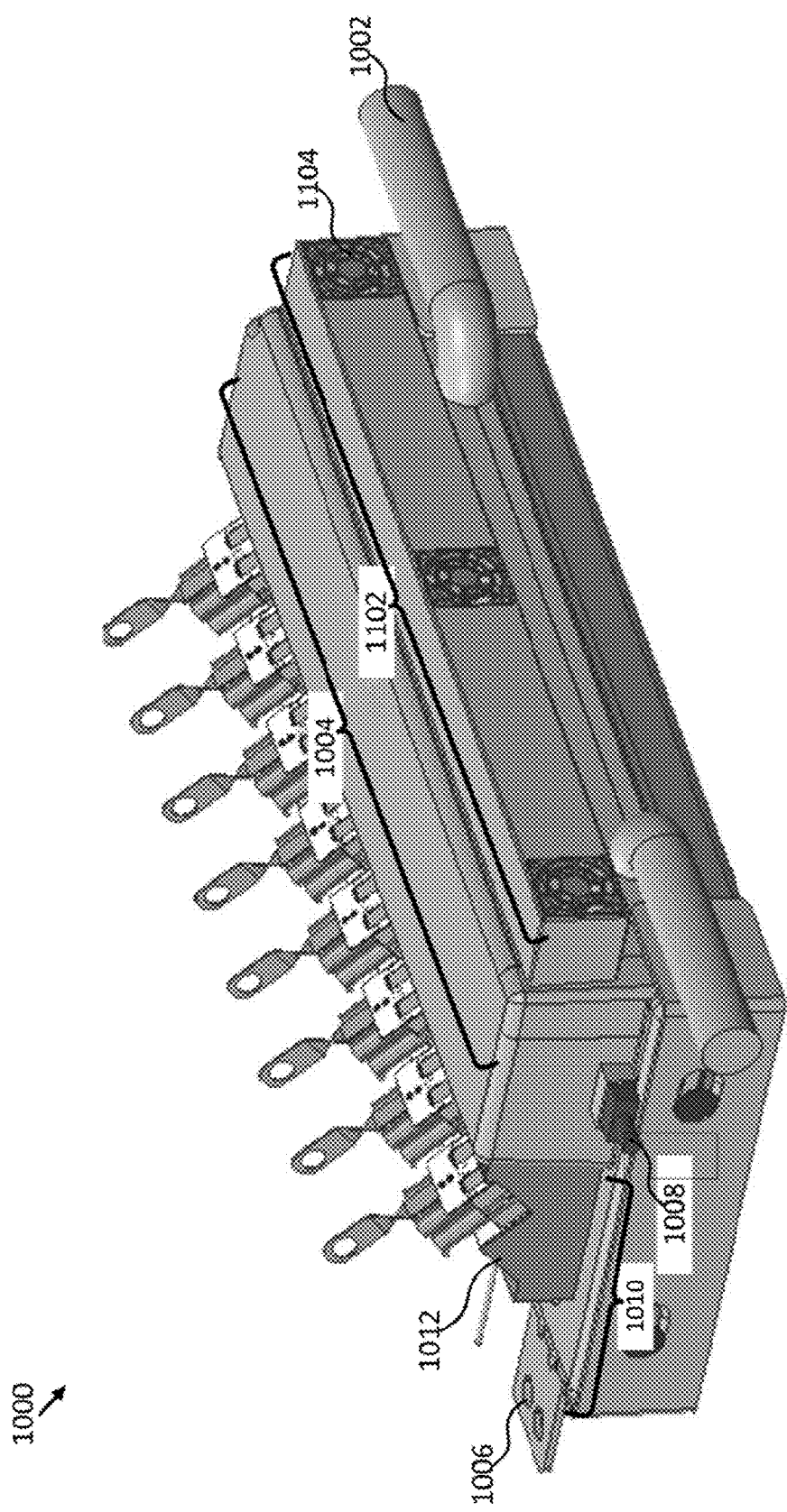

FIGS. 10 and 11 are renderings that illustrate an example power distribution unit (PDU) 1000 with example removable devices 1012 according to the present disclosure. Each of the example removable devices 1012 may be similar to the removable device 600 described above with respect to FIG. 6. According to some examples, the PDU 1000 has a 1 rack unit (U) form factor, has multiple bays for receiving removable devices as described herein, has a shelf configuration to support removable devices received by the multiple bays, and has features that permit the PDU 1000 to be mounted to a server frame (e.g., rear or above the server rack).

As shown in FIG. 10 and FIG. 11, the PDU 1000 includes a power connection 1002 that provide input power to the PDU 1000, a set of bays 1004 for receiving the removable devices 1012, and mounting brackets 1006 that permit the PDU 1000 to mount to a RETMA rail or a frame of a server rack. As shown, an optical connector 1008 to provide a network connection to a management controller included by the PDU 1000. As shown, a planar surface 1010 to support the removable devices 1012 the set of bays 1004 receive. As shown, the PDU 1000 includes a shared plenum 1102 and a set of shared fans 1104, which can provide air flow to the set of bays 1004.

For some examples, each bay in the set of bays 1004 is similar in features, operation and functionality to the bay 400 described with respect to FIGS. 4 and 5, and each of the removable devices 1012 is similar in features, operation and functionality to the removable device 500 described with respect to FIG. 5.

Figure 12:
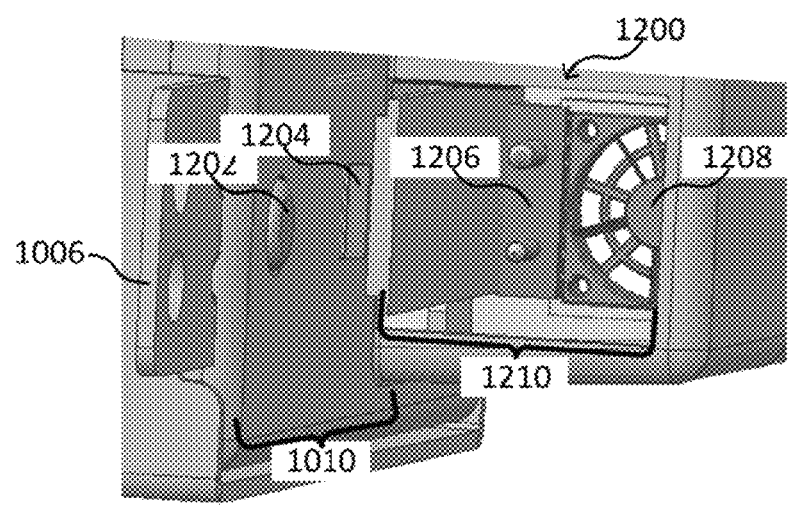
FIG. 12 is a rendering that illustrates an example bay of the example power distribution unit (PDU) of FIGS. 10 and 11.

FIG. 12 is a rendering that illustrates an example bay 1200 of the example power distribution unit (PDU) of FIGS. 10 and 11. Accordingly, a bay in the set of bays 1004 may be similar to the bay 1200. As noted herein, for some examples, the bay 1200 is similar in features, operation and functionality to the bay 400 described with respect to FIGS. 4 and 5. As shown in FIG. 12, the bay 1200 includes latching mechanisms 1202 and 1204 to retain a removable device 1012 when the bay 1200 is received. As shown, the bay 1200 includes a blindmate electrical connector 1206 to provide power to a removable device received by the bay 1200, and to communicate management signals between the bay 1200 and the remove device received by the bay 1200. As shown, the bay 1200 includes a fan 1208 to provide air flow to a removable device received by the bay 1200. As also shown, the bay 1200 includes an opening 1210 to receive a removable device.

Figure 13:
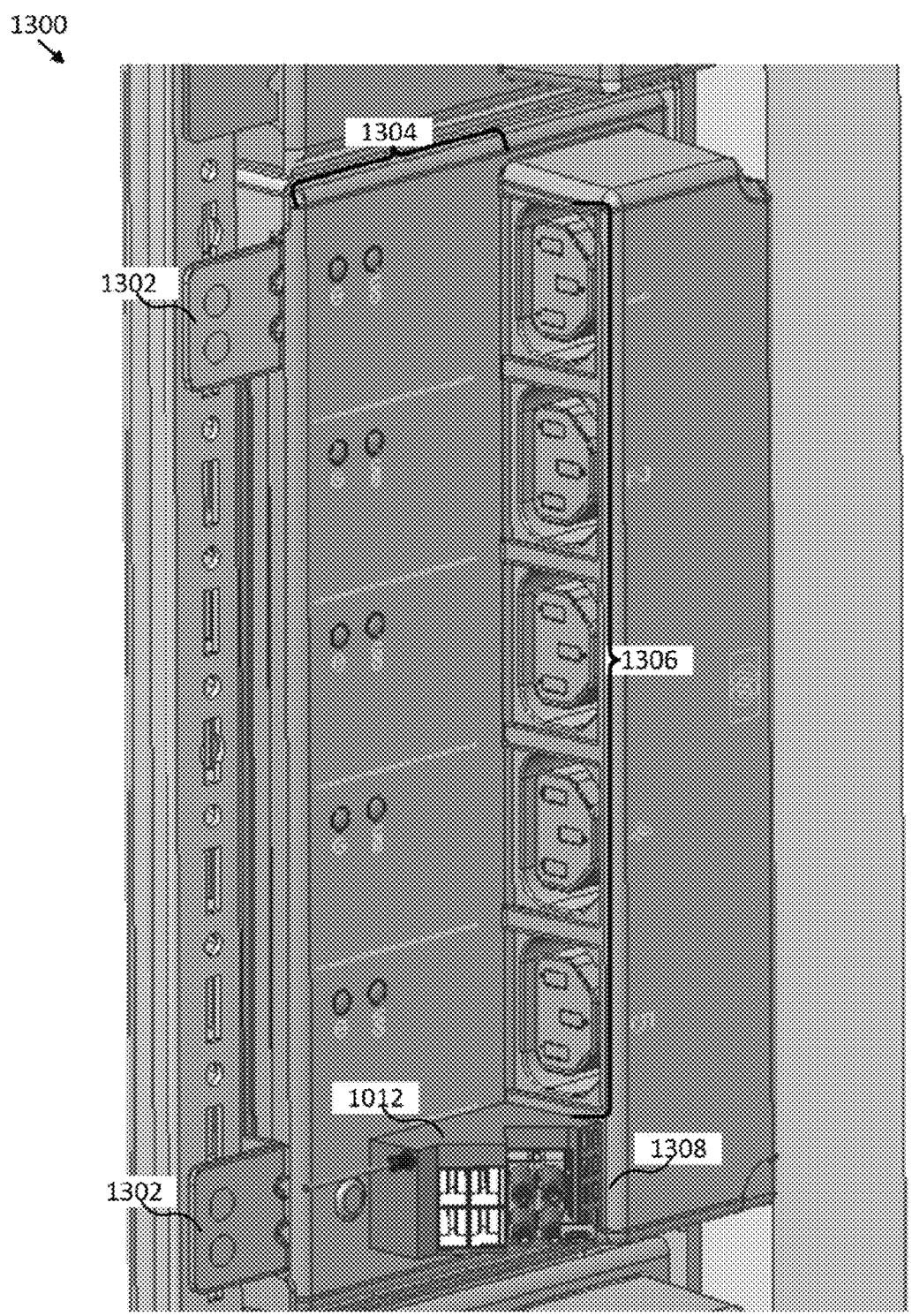
FIG. 13 is a rendering that illustrates an example power distribution unit (PDU) with an example removable device according to the present disclosure.

FIG. 13 is a rendering that illustrates an example power distribution unit (PDU) 1300 with the example removable device 1012 according to the present disclosure. As noted herein, the example removable devices 1012 may be similar to the removable device 600 described above with respect to FIG. 6. According to some examples, the PDU 1300 has a 1 rack unit (U) form factor, has multiple bays for receiving removable devices as described herein, has a shelf configuration to support a removable device received by a bay included by the PDU 1300, and has features that permit the PDU 1300 to be mounted to a server frame (e.g., rear or above the server rack).

As shown in FIG. 13, the PDU 1300 includes a mounting brackets 1302 that permit the PDU 1300 to mount to a server rack, a bay 1308 for receiving a removable device, the removable device 1012 received by (e.g., installed in) the bay 1308, a planar surface 1304 to support the removable devices 1012 received by the bay 1308, and a set of power outlets 1306 disposed adjacent to the bay 1308. For some examples, each power outlet in the set of power outlets 1306 may electrically couple to an electrical device (e.g., computer system, network equipment, or the like) to provide power to the electrical device over a power cord. Though the PDU 1300 illustrates a plurality of power outlets 1306 and a single bay, for some examples, the PDU 1300 includes a single power outlet and a single bay, or includes a plurality of power outlets and a plurality of bays.

For some examples, each bay in the set of bays 1004 is similar in features, operation and functionality to the bay 400 described with respect to FIGS. 4 and 5, and each of the removable devices 1012 is similar in features, operation and functionality to the removable device 500 described with respect to FIG. 5.

In the foregoing description, numerous details are set forth to provide an understanding of the subject disclosed herein. However, various examples may be practiced without some or all of these details. Some examples may include modifications and variations from the details discussed above. It is intended that the appended claims cover such modifications and variations.

The invention claimed is:

1. An apparatus, comprising:
   a bay to receive at least a portion of a housing of a removable device, the removable device to:
      receive an optical cable to couple the removable device to a network switch;
      receive an electrical cable;
      convert a first optical signal received through the optical cable to a first electrical signal transmitted through the electrical cable; and
      convert a second electrical signal received through the electrical cable to a second optical signal transmitted through the optical cable; and
   the bay further includes a management controller to:
      communicate a management signal with the removable device received by the bay;
      communicate with a switch management controller included by the network switch;
      cool the removable device received by the bay utilizing a cooling mechanism; and
      a power converter to provide converted power to the removable device received by the bay.

2. The apparatus of claim 1, wherein the management controller detects whether the removable device that has been received by the bay.

3. The apparatus of claim 1, wherein the management controller queries a status of the removable device that has been received by the bay.

4. The apparatus of claim 1, wherein the management controller adjusts the cooling mechanism according to a condition of the removable device that has been received by the bay.

5. The apparatus of claim 1, wherein the management controller communicates with a server management controller included by a server.

6. The apparatus of claim 5, wherein the electrical cable couples the removable device received by the bay to the server.

7. The apparatus of claim 1, wherein the management controller communicates with the switch management controller via an out-of-band communications network.

8. The apparatus of claim 1, wherein the cooling mechanism includes a fan controlled by the management controller.

9. The apparatus of claim 1, wherein the cooling mechanism includes a vent having adjustable shutters that selectively adjust airflow into the bay from the outside of the bay.

10. The apparatus of claim 1, wherein the cooling mechanism provides airflow to an air intake port of the removable device received by the bay.

11. A power distribution unit (PDU), comprising:
   at least one power outlet; and
   at least one bay for receiving at least a first portion of a housing of a removable device, the removable device to:
      receive an optical cable;
      receive an electrical cable;
      convert a first optical signal received through the optical cable to a first electrical signal transmitted through the electrical cable; and
      convert a second electrical signal received through the electrical cable to a second optical signal transmitted through the optical cable; and the bay further includes;
- a management controller to communicate a management signal with the removable device received by the bay;
- at least one of a radio Frequency Identification (RFID) interface, a Near Field Communication (NFC) interface, or a combination thereof, to communicate with the removable device; and
- a cooling mechanism to cool the removable device received by the bay.

12. The power distribution unit of claim 11, wherein the PDU is configured as a power strip.

13. The power distribution unit of claim 11, wherein the PDU comprises a power distribution unit housing including a planar surface, the at least one power outlet and the at least one bay being disposed on the planar surface, the at least one bay positioned on the planar surface such that at least a second portion of the housing of the removable device is supported by the planar surface when the housing is received by the bay.

14. The power distribution unit of claim 11, wherein the management controller communicates with a switch management controller via an out-of-band communications network.

15. A power distribution unit (PDU), comprising:
- at least one power outlet; and
- at least one bay for receiving at least a first portion of a housing of a removable device, the removable device to:
  - receive an optical cable to couple the removable device to a network switch;
  - receive an electrical cable;
  - convert a first optical signal received through the optical cable to a first electrical signal transmitted through the electrical cable; and
  - convert a second electrical signal received through the electrical cable to a second optical signal transmitted through the optical cable; and
- the bay further includes a management controller to:
  - communicate a management signal with the removable device received by the bay;
  - communicate with a switch management controller included by the network switch; and
  - cool the removable device received by the bay utilizing a cooling mechanism.

16. The PDU of claim 15, wherein the bay includes a Radio Frequency Identification (RFID) interface to communicate with the removable device received by the bay.

17. The PDU of claim 15, wherein a Near Field Communication (NFC) interface to communicate with the removable device received by the bay.

18. The PDU of claim 15, wherein the management controller communicates with a switch management controller via an out-of-band communications network.

19. The PDU of claim 15, wherein the PDU is configured as a power strip.

20. The PDU of claim 15, wherein the cooling mechanism includes a fan controlled by the management controller, a vent having adjustable shutters that selectively adjust airflow into the bay from the outside of the bay, or combinations thereof.

* * * * *